(12) United States Patent  
Koste et al.

(10) Patent No.: US 7,161,511 B2  
(45) Date of Patent: Jan. 9, 2007

(54) LINEARIZATION SYSTEM AND METHOD

(75) Inventors: Glen Peter Koste, Niskayuna, NY (US); Richard Louis Zinser, Niskayuna, NY (US); Graeme Colin McKinnon, Hartland, WI (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/145,486

(22) Filed: Jun. 3, 2005

(65) Prior Publication Data

US 2006/0273942 A1 Dec. 7, 2006

(51) Int. Cl.
*H01M 1/12* (2006.01)
*G01N 24/00* (2006.01)

(52) U.S. Cl. ............... 341/118; 324/322; 702/86
(58) Field of Classification Search ........ 324/307–322; 341/118, 120; 702/86, 87, 88, 89, 106, 107
See application file for complete search history.

(56) References Cited

U.S. PATENT DOCUMENTS

| | | | |
|---|---|---|---|
| 4,896,155 A | 1/1990 | Craiglow | |
| 5,172,059 A * | 12/1992 | den Boef | 324/307 |
| 5,594,612 A | 1/1997 | Henrion | |
| 5,872,814 A | 2/1999 | McMeekin | |
| 6,028,424 A | 2/2000 | Twichell et al. | |
| 6,118,396 A * | 9/2000 | Song | 341/137 |
| 6,268,814 B1 | 7/2001 | Kolsrud | |
| 6,911,925 B1 * | 6/2005 | Slavin | 341/120 |
| 2001/0033238 A1 * | 10/2001 | Velazquez | 341/118 |
| 2002/0175752 A1 * | 11/2002 | Pomata et al. | 330/141 |
| 2003/0006714 A1 * | 1/2003 | Choi | 315/169.3 |
| 2003/0167142 A1 * | 9/2003 | Chell et al. | 702/107 |
| 2005/0207515 A1 * | 9/2005 | Jensen et al. | 375/327 |

FOREIGN PATENT DOCUMENTS

EP 0407919 4/1966

OTHER PUBLICATIONS

US Patent Application entitled "Analog-to-Digital Converter Compensating Apparatus and Associated Methods" by Richard C. Gaus, Jr., U.S. Appl. No. 11/017,458, filed Dec. 20, 2004.
Commonly-Owned US Patent Application entitled "Analog-to-Digital Converter Compensation System and Method", by RL Zinser, no date.
AV Oppenheim, et al, "Digital Signal Processing" Digital Filter Design Techniques, Prentice Hall, Inc., ISBN 0-13-214635-5, 1975, pp. 242-244, no month.

* cited by examiner

*Primary Examiner*—Howard L. Williams
(74) *Attorney, Agent, or Firm*—Ann M. Agosti; Patrick K. Patnode (57) ABSTRACT

A system for training a linearization compensation model includes a tone generator for providing at least two different RF tones, receiver path components for processing the RF tones, an analog-to-digital converter for converting the processed RF tones into digital signals, and a processor for using the digital signals to generate the linearization error compensation model. The resulting compensation model is particularly useful in a linearization system which includes a receiver for measuring a signal, an electro-optical modulator configured for converting the measured signal to an optical signal, an optical-electrical detector configured for converting the optical signal to an analog electrical signal, an analog-to-digital converter for converting the analog electrical signal into a digital signal with the processor being used for removing linearization errors from the digital signal.

32 Claims, 7 Drawing Sheets

LINEARIZATION SYSTEM AND METHOD

BACKGROUND

The invention relates generally to linearization systems and methods and more particularly to magnetic resonance imaging (MRI) linearization systems and methods.

In magnetic resonance imaging, a chain of radio frequency (RF) components is typically used to condition analog waveforms received by coils in the imaging volume for digitization by an analog-to-digital converter. The chain of RF components typically includes amplifiers, attenuators, mixers, cables, electrical-to-optical modulators, optical-to-electrical receivers, and optical transmission structures such as fibers. Some of these components have non-linear responses which distort the signals. In particular, when optical systems include electrical-to-optical modulators, the modulators are a significant contributor to nonlinearization. Conventional approaches to minimizing nonlinearization in magnetic resonance imaging machines rely on careful design and selection of components, particularly variable gain and attenuation components.

It would therefore be desirable to have a linearization compensation system and method which do not have the design constraints of conventional techniques.

BRIEF DESCRIPTION

Briefly, in accordance with one embodiment of the present invention, a linearization system for training a linearization error compensation model comprises a tone generator for providing at least two different RF tones, receiver path components for processing the RF tones, an analog-to-digital converter for converting the processed RF tones into digital signals, and a processor for using the digital signals to train the linearization error compensation model in advance of operational use.

In accordance with another embodiment of the present invention, a linearization system comprises: a receiver for measuring a signal during operational use of the linearization system, receiver path components for processing the measured signal comprising an electro-optical modulator configured for converting the measured signal to an optical signal and an optical-electrical detector configured for converting the optical signal to an analog electrical signal, an analog-to-digital converter for converting the analog electrical signal into a digital signal, and a processor including a linearization error compensation model for removing linearization errors from the digital signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
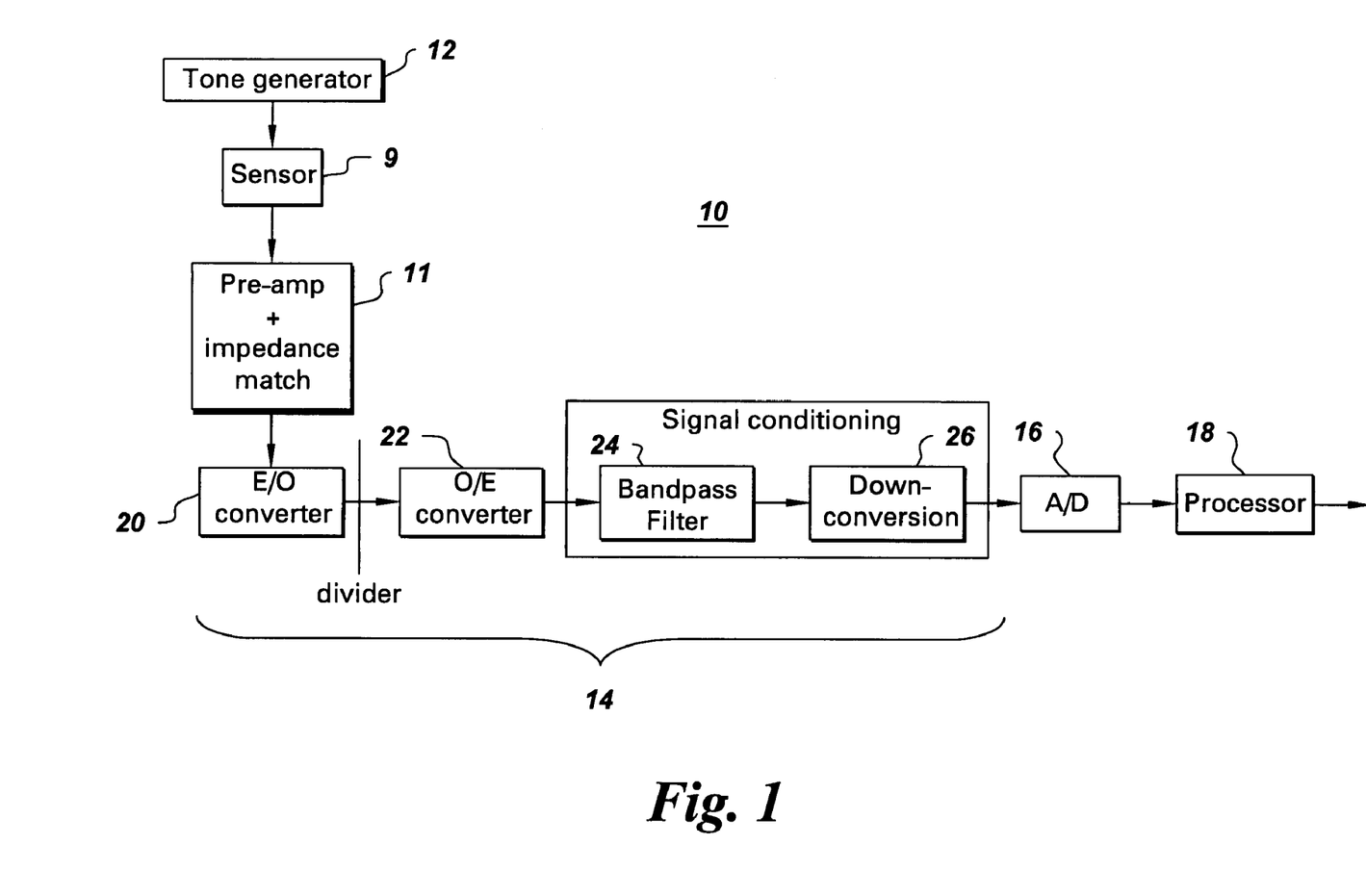
FIGS. 1 and 2 are block diagrams of linearization systems in accordance with several embodiments of the present invention.
Figure 2:
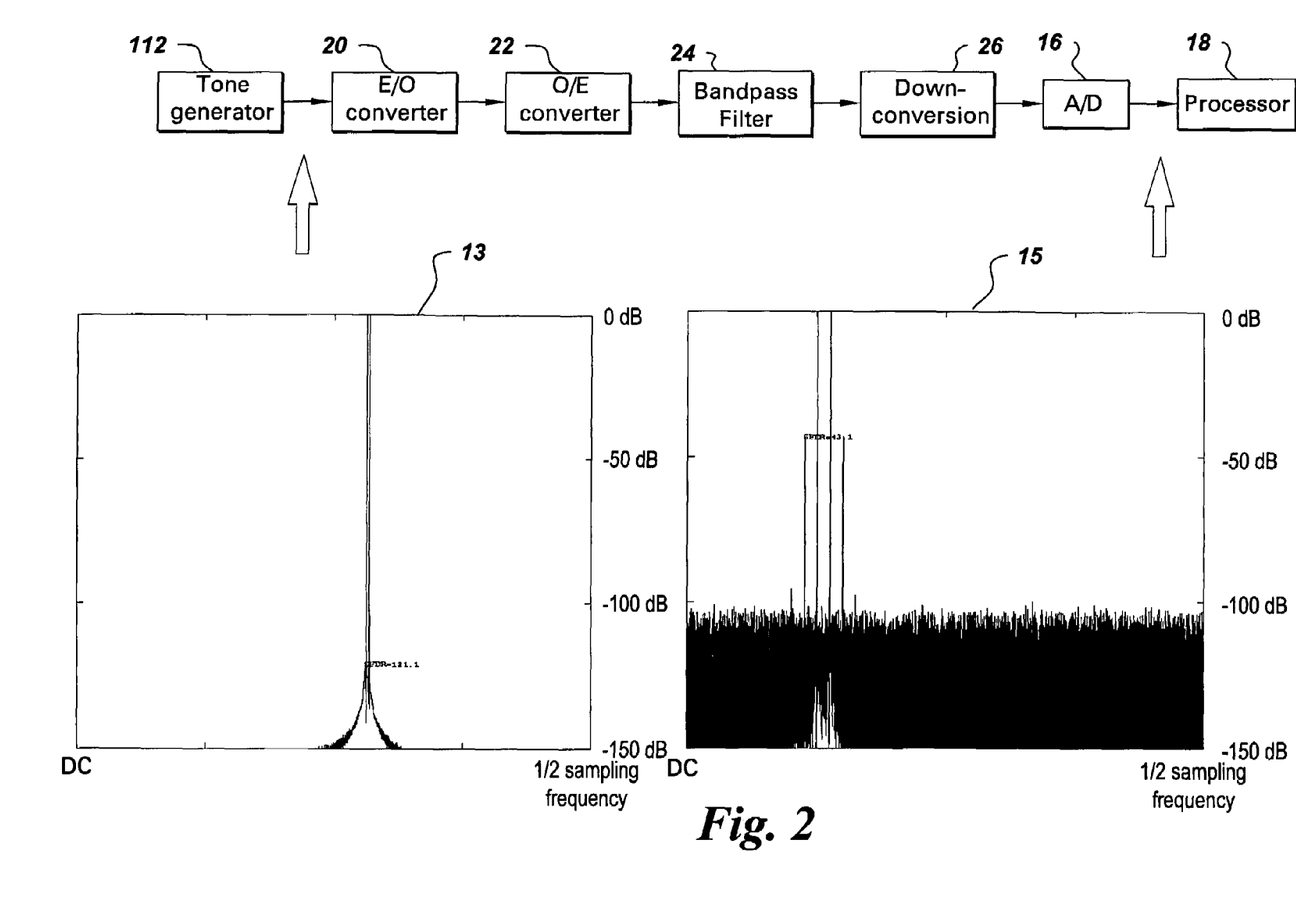

FIGS. 1 and 2 are block diagrams of linearization systems in accordance with several embodiments of the present invention. In these embodiments, linearization system 10 comprises: a tone generator 12 (FIG. 1) or 112 (FIG. 2) for providing at least two different RF tones, receiver path components 14 for processing the RF tones, an analog-to-digital converter 16 for converting the processed RF tones into digital signals, and a processor 18 for using the digital signals to train a linearization error compensation model prior to operational use of the linearization system. FIG. 1 additionally illustrates a sensor 9 and associated pre-amplification and impedance matching components 11 which would typically be present during operational use. Operational use is intended to mean use of the system in its operational mode. In one example wherein the linearization system comprises an imaging linearization system, operational use occurs when an object is being imaged. FIG. 2 additionally illustrates a spectral plot 13 representative of a simulation of a set of generated tones and a spectral plot 15 representative of a simulation of the tones (including distortion) after being processed through the receiver path and analog-to-digital converter.

Figure 3:
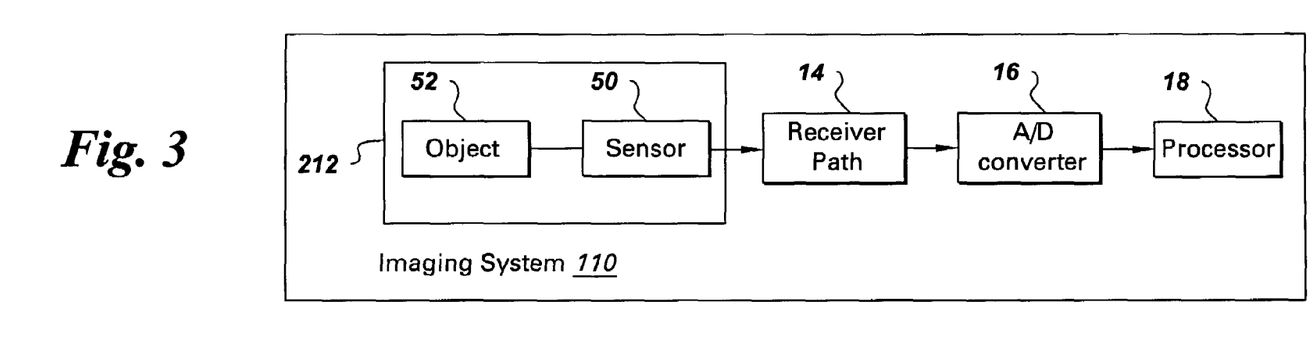
FIG. 3 is a block diagram of an imaging linearization system in accordance with another embodiment of the present invention.
Figure 4:
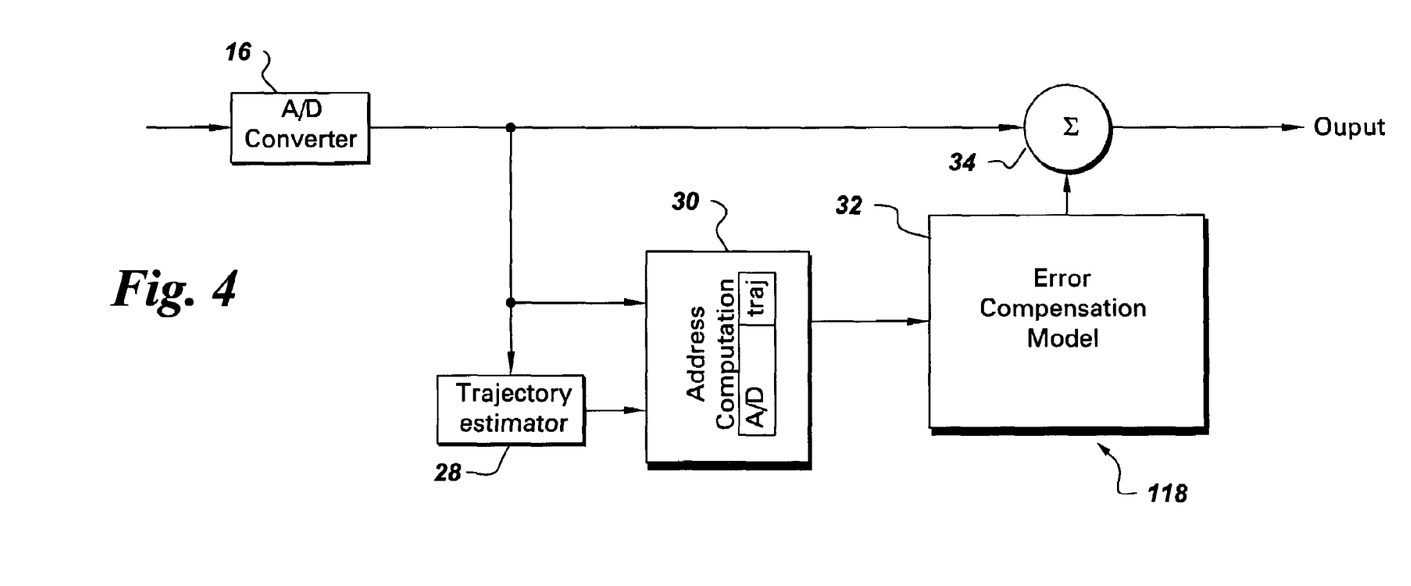
FIGS. 4–7 are block diagrams of several embodiments of processors for use in accordance with the linearization system embodiments of the present invention.

The linearization system embodiments of the present invention are particularly useful for sensing systems, and more particularly imaging systems, but are not limited to such systems. FIG. 3 is a block diagram of a sensing or imaging linearization system 110 in accordance with another embodiment of the present invention. In other more specific embodiments, the linearization system comprises a magnetic resonance linearization system or an ultrasound linearization system. When an imaging system is involved, in some embodiments the imaging system itself is used for tone generation. For example, in one embodiment, the tone generator comprises the imaging system 110 (or more specifically, in some embodiments, a transmit portion including a sensor 30 in combination with an object 52 (FIG. 3) being imaged). In this embodiment, at least two different tones are generated by the imaging system 110 in the object 52 being imaged.

In slightly less complex embodiments, which are useful in imaging and other system embodiments, the tone generator comprises an electronic signal generator 112 (FIG. 2). In such embodiments, the signal can be supplied directly in the region of interest for receipt by the receiver path components or transmitted via an antenna, for example.

Although various receiver path components 14 (FIG. 1) are shown for purposes of example, receiver path components may generally include analog components, digital components, optical components, electrical components, or combinations thereof. In one specific embodiment, receiver path components 14 comprise an electrical-to-optical converter 20 and an optical-to-electrical converter 22. In a more specific embodiment, the electrical-to-optical converter comprises a modulator such as a Mach Zehnder modulator. Such components often result in linearization issues which can be addressed by embodiments of the present invention.

Receiver path components may additionally comprise a band pass filter 24 and a down-conversion module 26 such as a mixer for moving the signal from a higher frequency band to a lower frequency band. A collective gain of the band pass filter and the down-conversion module is typically configured to comprise a variable collective gain so that processor 18 can further be configured to generate the linearization error compensation model as a function of the variable collective gain. This is particularly useful in a magnetic resonance imaging system, for example, wherein about fifteen gain settings typically exist.

In another embodiment for use on its own or in combination with or the variable gain embodiment, the processor is configured for generating the linearization error compensation model by using spectral locations of intermodulation distortion products from the digital signals. Typically, the processor uses the spectral locations of the intermodulation distortion products by extracting magnitudes and phase values for each distortion product, transforming the magnitudes and the phase values into the time domain, and inserting the transformed magnitudes and the transformed phase values into the linearization error compensation model.

FIGS. 4–7 are block diagrams of several embodiments of processors for use in accordance with the linearization system embodiments of the present invention. In processor 118 of the embodiment of FIG. 4, the linearization error compensation model 32 comprises a model including a plurality of compensation values corresponding to respective digital signals and trajectory estimations. The digital signal portion (A/D) of address computation module 30 is obtained from analog-to-digital converter 16, and the trajectory portion (traj) is obtained from a trajectory estimator 28.

In one example of a twenty bit address wherein the data is stored in a look-up table of the linearization error compensation model, the digital signal portion occupies fourteen bits, the trajectory estimation portion occupies six bits, and there is one address for each combination of the two portions [A/D bits][traj bits] to position the associated error value as calculated from the digital signal. If more than one instance of a particular [A/D bits][traj bits] combination occurs during training, in one embodiment the average error value for the multiple instances is stored in the corresponding address. Typically, in this embodiment, the multiple error values for each address are stored and averaged at the end of the training sequence. Another optional feature when forming a look-up table is to use an interpolation algorithm to fill in zero-valued table entries with error estimates based on nearby non-zero entries.

For trajectory estimation, any of a number of techniques may be used and the size of any associated table or data storage of the error compensation model is typically a factor in selecting among the techniques. For example, in one embodiment, the processor is configured for performing trajectory estimation by obtaining the slope of the signal. The slope itself can be obtained by any appropriate technique with several options including: current value minus last value divided by intervening time; if intervening time is constant, then current value minus last value; and filtering.

Another example trajectory estimation technique is to use the previous sample value of the digital signal. A more specific aspect of this example is to use a specific number of most significant bits of the previous sample. In the example above of a six bit trajectory portion, the number of bits would be six. The most significant bit example works particularly well at low frequencies. In one embodiment, low frequencies are defined as frequencies in the bottom third of the frequency spectrum of interest.

Still another trajectory example is one wherein the processor is configured for performing trajectory estimation by truncating and concatenating one or more of the previous sample values of the signal. For example, in one embodiment, the most significant bits from the last four samples are selected. This example is expected to work particularly well at high frequencies. In one embodiment, high frequencies are defined as frequencies above the bottom third of the frequency spectrum of interest.

Figure 5:
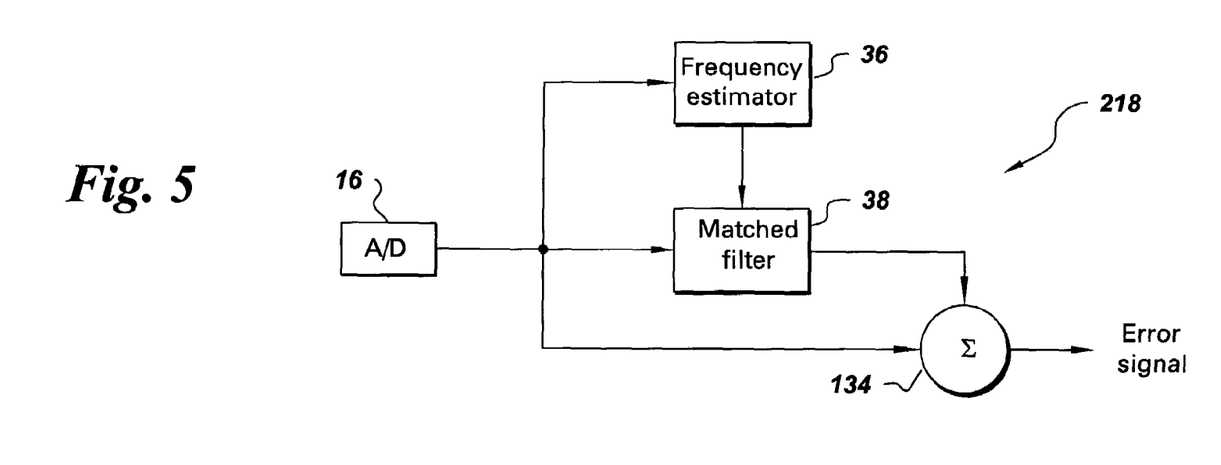
Figure 6:
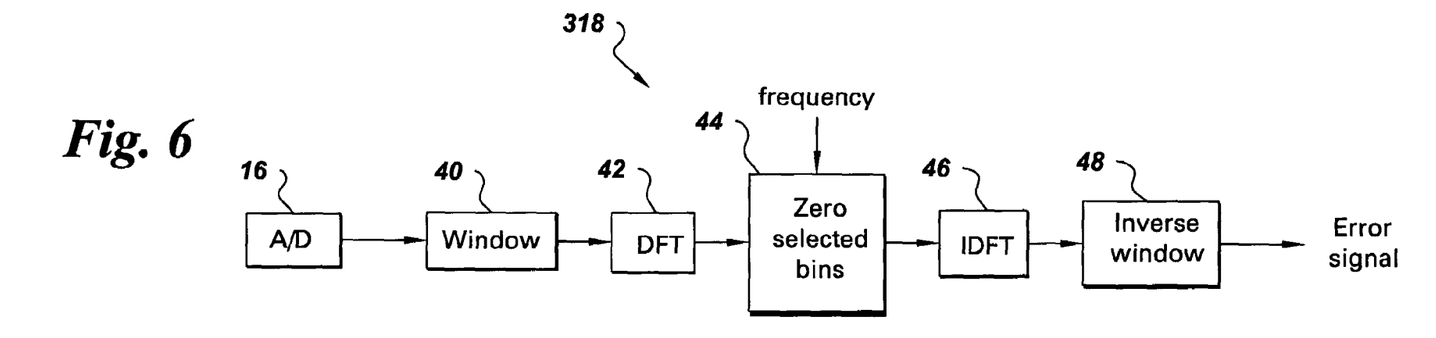
Figure 7:
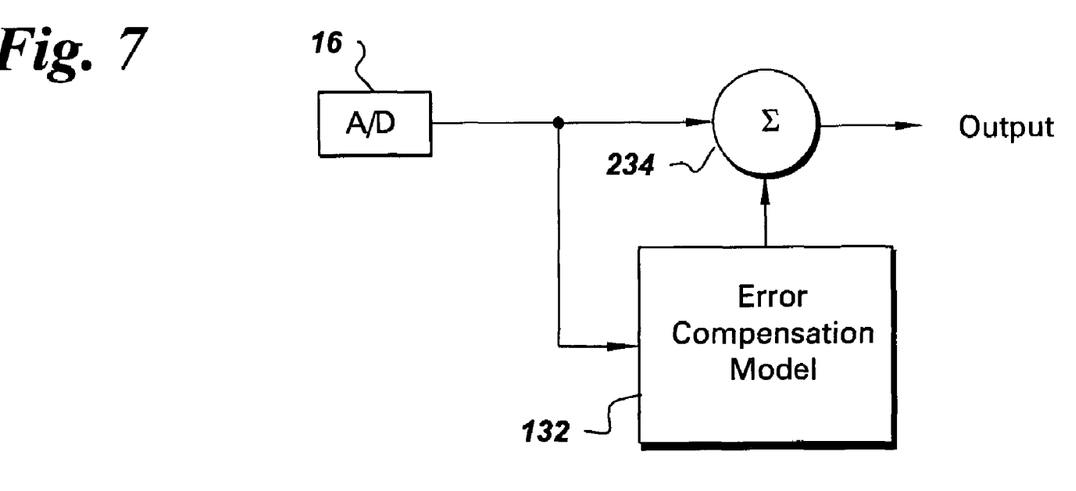

FIGS. 5 and 6 illustrate embodiments which can be used to obtain the error signal for error compensation model 32 (FIG. 4) or 132 (FIG. 7). In one example of a error signal obtaining technique, the processor is configured for obtaining the compensation values corresponding to the respective digital signals by estimating distortion free signals and subtracting distorted signals via a subtractor 134. More specifically, in the example of FIG. 5, the processor is configured for estimating the distortion free signals by using a matched filter 38 around an estimated frequency of calibration (via frequency estimator 36). The matched filter is designed to resemble the expected signal at the estimated frequency.

The frequency estimation is typically obtained via a control signal. In many embodiments, the frequency estimation will be readily known, such as for example, in embodiments wherein the tone generator and the sampling clock (oscillator) are locked or synchronized. In embodiments wherein locking is not feasible, it is possible to process the signal to minimize noise resulting from the sampling clock.

In another example of an error signal obtaining technique, processing comprises obtaining a compensation value by direct estimation. In a more specific embodiment, as shown in FIG. 6, processor 318 is configured for obtaining a compensation value corresponding to a respective digital signal by applying a time domain window 40, performing a discrete Fourier transform 42 on digital signals within the time domain window, zeroing out transform bins 44 except for bins within lobes on selected spurious frequencies, performing an inverse Fourier transform 46, and obtaining resulting signals from applying an inverse of the time domain window 48. In one example, the discrete Fourier transform comprises a fast Fourier transform.

Figure 9:
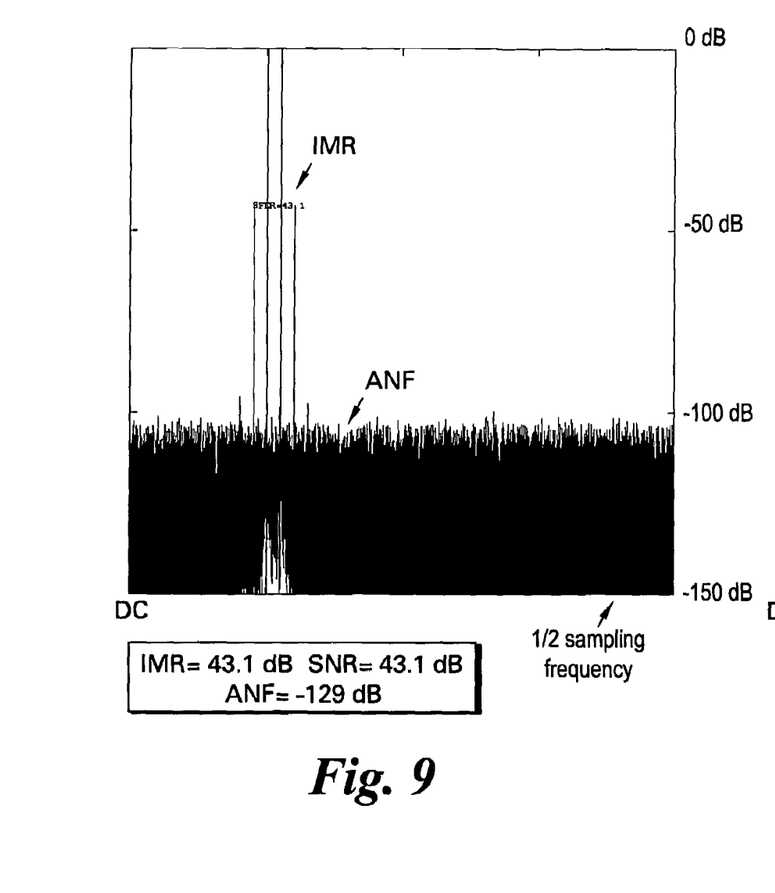
FIGS. 9 and 10 illustrate simulations of output signals, in accordance with one embodiment, respectively with and without the linearization compensation.
Figure 10:
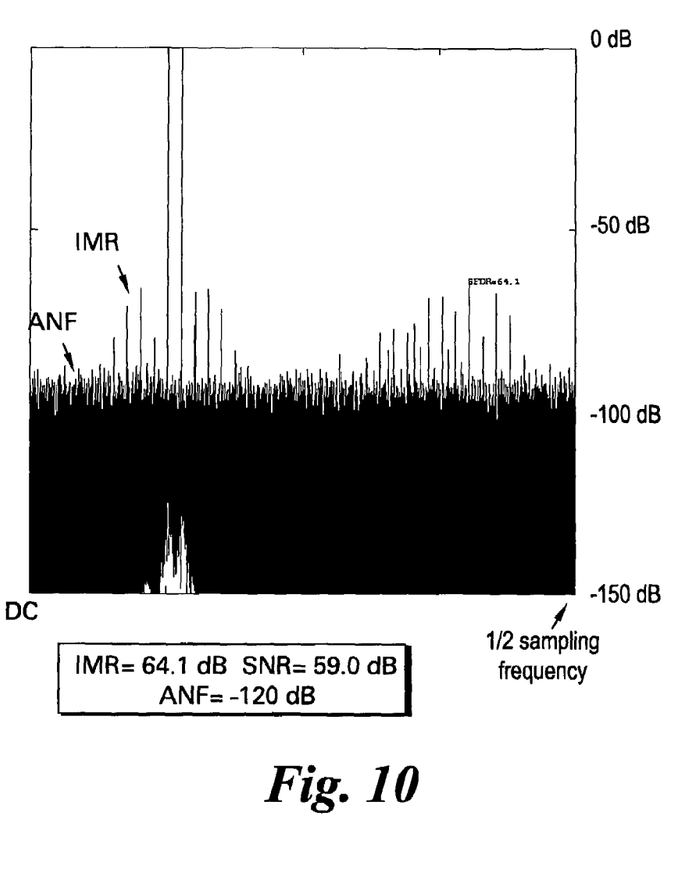

In embodiments wherein analog-to-digital converter errors are the primary source of linearization errors, the lobe locations are typically at the harmonic frequencies. When the harmonic frequencies are unknown, an alternative is to zero out all transform bins near calibration frequencies, DC, and any bins below a predetermined threshold. The threshold is set according to that which would typically remove the noise floor (ANF) which is shown in FIGS. 9, and 10 and this embodiment is thus sometimes referred to as the "lawnmower" embodiment.

In embodiments wherein modulation is the primary source of linearization errors, the lobe locations are typically located at intermodulation distortion product frequencies. This particular windowing embodiment is not limited to the context of two RF signals and is additionally described in commonly assigned and concurrently filed U.S. application Ser. No. 11/145,443 invented by Richard Zinser and entitled "Analog-To-Digital Converter Compensation System and Method," which is herein incorporated by reference.

In the example of FIG. 6, the role of the time domain window 40 is to pack the energy or data densely into one area of interest. The intermodulation distortion products of interest are typically about the same distance away from the primary frequency as the difference between the two different RF tones. Thus, selected distortion product frequencies can be estimated, with the frequencies of particular interest generally corresponding to the third and fifth order products. The inverse window 48 is typically an inverted version of time domain window 40 except that, in some embodiments, time domain signals are removed at the edges of the inverse window to reduce potential noise effects.

FIG. 7 is a block diagram of another embodiment of a processor for use in accordance with the linearization system embodiments of the present invention wherein the linearization error compensation model comprises a model with a plurality of compensation values corresponding to respective digital signals and not dependent upon trajectory estimations.

The above embodiments have been discussed in the context of using the two tones to generate the linearization error compensation model. Another embodiment of the present invention is the use of the resulting model within a linearization system in an operational mode. More specifically, in one embodiment, as shown in FIG. 8, a linearization system comprises: a receiver 54 for measuring a signal, receiver path components for processing the measured signal comprising an electro-optical modulator 20 configured for converting the measured signal to an optical signal and an optical-electrical detector 22 configured for converting the optical signal to an analog electrical signal, an analog-to-digital converter 16 for converting the analog electrical signal into a digital signal, and a processor 418 including a linearization error compensation model for removing linearization errors from the digital signal.

Figure 8:
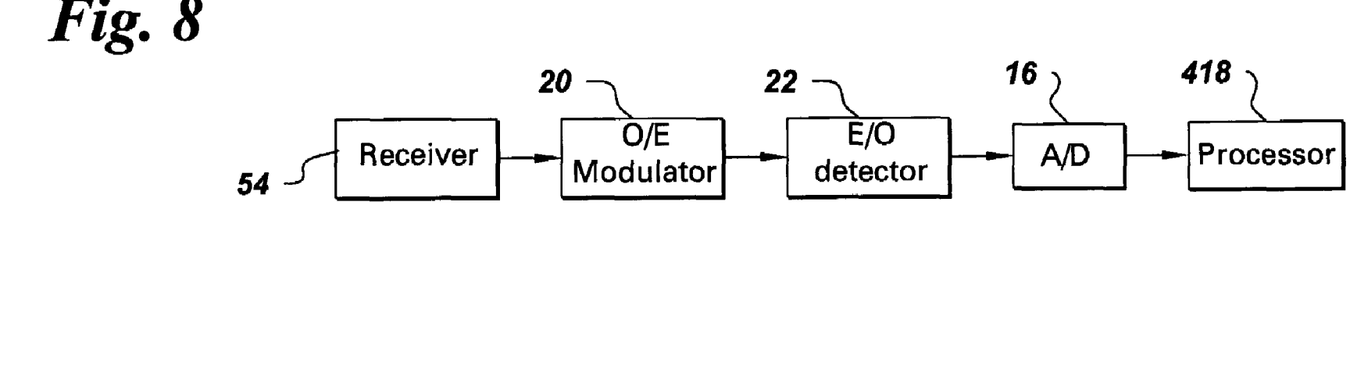
FIG. 8 is a block diagram of a linearization system in accordance with another embodiment of the present invention.

The examples discussed above with respect to the receiver path and the structure of the compensation model are additionally applicable to the embodiment of FIG. 8. For example, the receiver path components may further comprise a band pass filter and a down-conversion module as discussed above with respect to FIGS. 1 and 2. As another example, the linearization compensation model may comprise a plurality of compensation values corresponding to respective digital signals and trajectory estimations as described with respect to FIG. 4.

FIGS. 9 and 10 illustrate simulations of output signals, in accordance with a simulation of one operational mode embodiment, respectively with and without the linearization compensation. The simulation of FIG. 10 represents the expected output from the combined embodiments of FIGS. 4 and 6. The intermodulation ratio (IMR) was increased from 43.1 db to 64.1 dB, and the signal to noise ratio (SNR) was improved from 43.1 dB to 59.0 db, while the noise floor (ANF) was increased slightly from −129 dB to −120 dB. Although two tones were used in the simulation for purposes of example, additional tones, such as four tones, for example, may optionally be useful for further increasing the intermodulation and signal to noise ratios.

Figure 11:
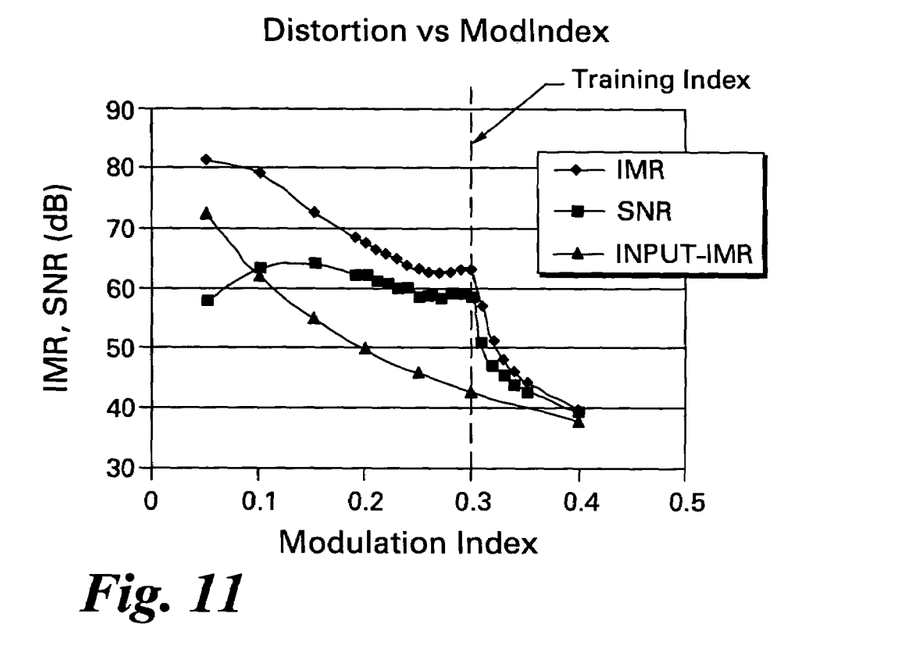
FIGS. 11 and 12 illustrate simulations of distortion versus modulation graphs in accordance with one embodiment with several different training indexes.
Figure 12:
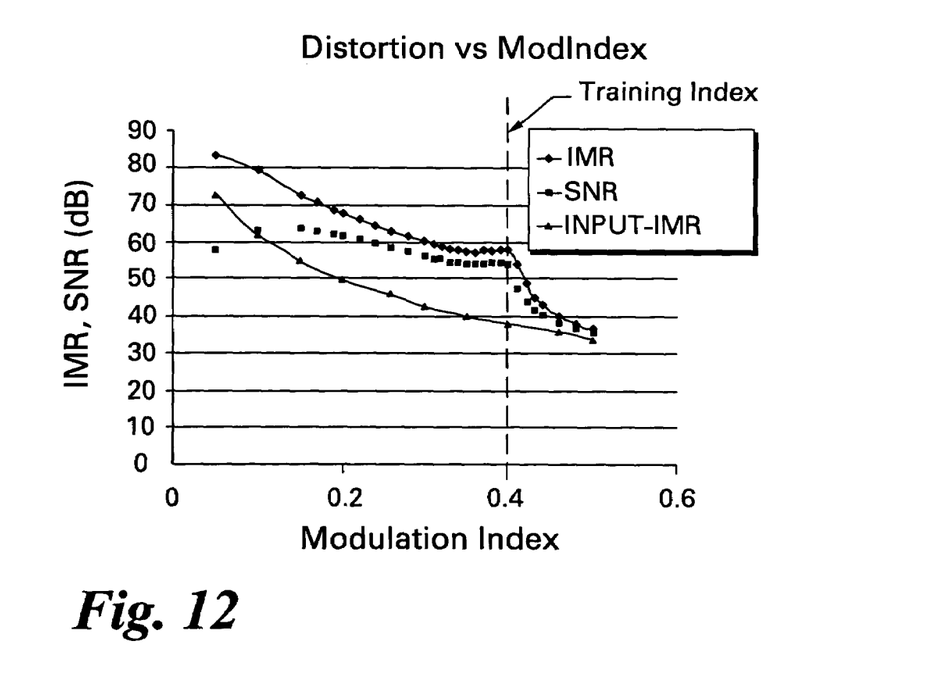

FIGS. 11 and 12 illustrate simulations of distortion versus modulation graphs in accordance with one embodiment with several different training indexes (0.3 for FIG. 11 and 0.4 for FIG. 12). Aspects of the present invention have been simulated and several optional training signal (RF tone) recommendations have resulted, particularly for embodiments wherein the tone generator comprises an electronic signal generator 112 (FIG. 2). It is recommended that the training signals have an amplitude (modulation index) at least approximately equal to the peak operating point amplitude of the system which is expected when the system is in an operational mode. As can be seen when comparing the graph of FIG. 11 with that of FIG. 12, the operational IMR at 0.4 for the embodiment wherein the training index is 0.3 is only about 40 dB whereas the operational IMR at 0.4 for the embodiment wherein the training index is 0.4 is improved in that it is closer to 60 dB.

Additionally, it is recommended that, when a band pass filter 24 (FIG. 1) is used, the filter is selected so that third order intermodulation distortion products lie within plus or minus 1 dB of the filter pass band. Lastly, it is noted that increasing the number of training signal sets decreases noise from use of the compensation model in operational mode.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A linearization system for training a linearization error compensation model comprising:
    (a) a tone generator for providing at least two different RF tones;
    (b) receiver path components for processing the RF tones;
    (c) an analog-to-digital converter for converting the processed RF tones into digital signals; and
    (d) a processor for using the digital signals to train the linearization error compensation model in advance of operational use, wherein the processor is configured for training the linearization error compensation model by using spectral locations of intermodulation distortion products from the digital signals and wherein using the spectral locations of the intermodulation distortion products comprises extracting magnitudes and phase values for each distortion product, transforming the magnitudes and the phase values into the time domain, and inserting the transformed magnitudes and the transformed phase values into the linearization error compensation model.

2. The system of claim 1 wherein the linearization error compensation model comprises a look up table.

3. The system of claim 1 wherein the receiver path components comprise an electrical-to-optical converter and an optical-to-electrical converter.

4. The system of claim 3 wherein the electrical-to-optical converter comprises a modulator.

5. The system of claim 3 wherein the receiver path components further comprise a band pass filter and a down-conversion module.

6. The system of claim 1 wherein the tone generator comprises an electronic signal generator.

7. The system of claim 1 wherein the system comprises an imaging system, and wherein the tone generator comprises a transmit portion of the imaging system.

8. The system of claim 1 wherein the system comprises an imaging system, and wherein the tone generator comprises the imaging system in combination with an object being imaged.

9. The system of claim 1 wherein the linearization error compensation model comprises a model including a plural ity of compensation values corresponding to respective digital signals and trajectory estimations.

10. The system of claim 9 wherein the processor is configured for obtaining the compensation values corresponding to the respective digital signals by estimating distortion free signals and subtracting distorted signals.

11. The system of claim 10 wherein the processor is configured for estimating the distortion free signals by using a matched filter around an estimated frequency of calibration.

12. The system of claim 9 wherein the processor is configured for obtaining a compensation value by direct estimation.

13. The system of claim 12 wherein the processor is configured for obtaining a compensation value corresponding to a respective digital signal by applying a time domain window, performing a discrete Fourier transform on digital signals within the time domain window, zeroing out transform bins except for bins within lobes on selected spurious frequencies, performing an inverse Fourier transform, and obtaining resulting signals from applying an inverse of the time domain window.

14. The system of claim 9 wherein the processor is configured for performing trajectory estimation by obtaining the slope of the signal.

15. The system of claim 9 wherein the processor is configured for performing trajectory estimation by using the previous sample value of the signal.

16. The system of claim 9 wherein the processor is configured for performing trajectory estimation by truncating and concatenating one or more of the previous sample values of the signal.

17. The system of claim 1 wherein the linearization error compensation model comprises a model with a plurality of compensation values corresponding to respective digital signals.

18. The system of claim 1 wherein the linearization system comprises a sensing linearization system.

19. The system of claim 1 wherein the linearization system comprises a magnetic resonance linearization system.

20. The system of claim 1 wherein the linearization system comprises an ultrasound linearization system.

21. A linearization system for training a linearization error compensation model comprising:
 (a) a tone generator for providing at least two different RF tones;
 (b) receiver path components for processing the RF tones, wherein the receiver path components comprise a band pass filter and a down-conversion module;
 (c) an analog-to-digital converter for converting the processed RF tones into digital signals; and
 (d) a processor for using the digital signals to train the linearization error compensation model in advance of operational use,
 wherein a collective gain of the band pass filter and the down-conversion module comprises a variable collective gain, and wherein the processor is further configured to train the linearization error compensation model as a function of the variable collective gain.

22. A linearization system comprising:
 (a) a receiver for measuring a signal during operational use of the linearization system;
 (b) receiver path components for processing the measured signal, comprising an electro-optical modulator configured for converting the measured signal to an optical signal and an optical-electrical detector configured for converting the optical signal to an analog electrical signal;
 (c) an analog-to-digital converter for converting the analog electrical signal into a digital signal; and
 (d) a processor including a linearization error compensation model for removing linearization errors from the digital signal, wherein the linearization compensation model comprises a plurality of compensation values corresponding to respective digital signals and trajectory estimations.

23. The system of claim 22 wherein the receiver path components further comprise a band pass filter and a down-conversion module.

24. The system of claim 23 wherein a collective gain of the band pass filter and the down-conversion module comprises a variable collective gain, and wherein the linearization error compensation model is based on a function of the variable collective gain.

25. The system of claim 22 wherein the linearization system comprises a sensing linearization system.

26. The system of claim 22 wherein the linearization system comprises a magnetic resonance linearization system.

27. The system of claim 22 wherein the linearization system comprises an ultrasound linearization system.

28. A linearization method for training a linearization error compensation model comprising:
 (a) providing at least two different RF tones;
 (b) processing the RF tones along a receiver path including an electrical-to-optical converter and an optical-to-electrical converter
 (c) converting the processed RF tones into digital signals; and
 (d) using spectral locations of intermodulation distortion products of the digital signals to train the linearization error compensation model in advance of operational use, wherein using the spectral locations of the intermodulation distortion products comprises extracting magnitudes and phase values for each distortion product, transforming the magnitudes and the phase values into the time domain, and inserting the transformed magnitudes and the transformed phase values into the linearization error compensation model.

29. The method of claim 28 wherein the linearization error compensation model comprises a model including a plurality of compensation values corresponding to respective digital signals and trajectory estimations.

30. The method of claim 29 wherein the processor is configured for obtaining a compensation value corresponding to a respective digital signal by applying a time domain window, performing a discrete Fourier transform on digital signals within the time domain window, zeroing out transform bins except for bins within lobes on selected spurious frequencies, performing an inverse Fourier transform, and obtaining resulting signals from applying an inverse of the time domain window.

31. A linearization method comprising:
 (a) measuring a signal during operational use of the linearization system;
 (b) processing the measured signal along a receiver path including an electro-optical modulator configured for converting the measured signal to an optical signal an optical-electrical detector configured for converting the optical signal to an analog electrical signal;

(c) converting the analog electrical signal into a digital signal; and (d) using a processor including a linearization error compensation model for removing linearization errors from the digital signal, wherein the linearization compensation model comprises a plurality of compensation values corresponding to respective digital signals and trajectory estimations.

32. The method of claim 31 wherein the linearization system comprises a magnetic resonance linearization system.

* * * * *